United States Patent
Wang

(10) Patent No.: US 7,927,499 B2
(45) Date of Patent: Apr. 19, 2011

(54) SUBSTRATE HAVING BLIND HOLE AND METHOD FOR FORMING BLIND HOLE

(75) Inventor: Te-Chun Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 914 days.

(21) Appl. No.: 11/837,010

(22) Filed: Aug. 10, 2007

(65) Prior Publication Data

US 2008/0041822 A1 Feb. 21, 2008

(30) Foreign Application Priority Data

Aug. 18, 2006 (TW) ................................ 095130527

(51) Int. Cl.
*H01B 13/00* (2006.01)
(52) U.S. Cl. ............ 216/94; 216/18; 361/760; 257/687; 257/773; 257/774
(58) Field of Classification Search ................... 216/94, 216/18; 361/760; 257/687, 773, 774
See application file for complete search history.

(56) References Cited

U.S. PATENT DOCUMENTS

| 5,214,000 A * | 5/1993 | Chazan et al. ................... 216/18 |
| 6,258,449 B1 | 7/2001 | Nagasawa et al. |
| 6,831,009 B2 | 12/2004 | Itabashi et al. |
| 6,946,737 B2 * | 9/2005 | Sir et al. ......................... 257/773 |
| 7,595,454 B2 * | 9/2009 | Kresge et al. .................. 174/262 |

FOREIGN PATENT DOCUMENTS

| JP | 5206596 A | 8/1993 |
| TW | 448709 | 8/2001 |
| TW | 583338 | 4/2004 |

* cited by examiner

*Primary Examiner* — Nadine G Norton
*Assistant Examiner* — Mahmoud Dahimene
(74) *Attorney, Agent, or Firm* — Volentine & Whitt, P.L.L.C.

(57) ABSTRACT

A substrate having a blind hole and a method for forming the blind hole. The method includes: (a) providing a substrate having a lower dielectric layer, a copper layer, and an upper dielectric layer; and (b) forming an upper dielectric layer through hole and a copper layer through hole by etching through the upper dielectric layer and the copper layer with laser, and forming a cavity on the lower dielectric layer by using the laser, in which the aperture of the cavity on the upper surface of the lower dielectric layer is larger than that of the copper layer through hole. Therefore, a blind hole space in a shape of a rivet is formed, so that after the blind hole space is electroplated with an electroplating copper layer, the bonding force between the electroplating copper layer and the copper layer is enhanced.

9 Claims, 9 Drawing Sheets

SUBSTRATE HAVING BLIND HOLE AND METHOD FOR FORMING BLIND HOLE

BACKGROUND OF THE INVENTION

1. Field of the Invention

The present invention relates to a substrate structure and a process thereof. More particularly, the present invention relates to a substrate having a blind hole and a method for forming the blind hole.

2. Description of the Related Art

FIGS. 1 to 3 show schematic views of steps of a conventional method for forming a blind hole in a substrate. In FIG. 1, firstly, a substrate 1 is provided, and the substrate 1 includes a lower dielectric layer 11, a copper layer 12, and an upper dielectric layer 13. The copper layer 12 is located between the lower dielectric layer 11 and the upper dielectric layer 13. The upper dielectric layer 13 has an upper surface 131, and the copper layer 12 has an upper surface 121. Under normal circumstances, the substrate 1 further comprises a copper layer (not shown) which exists on the upper surface 131 of the upper dielectric layer 13. The materials of the lower dielectric layer 11 and the upper dielectric layer 13 are generally epoxy, phenolic, or polyester.

Next, in FIG. 2, a blind hole 132 is formed by processing the upper surface 131 of the upper dielectric layer 13 downward by laser processing or chemical etching, and the blind hole 132 penetrates the upper dielectric layer 13 and exposes the upper surface 121 of the copper layer 12.

Finally, in FIG. 3, an electroplating copper layer 14 is formed on the side wall of the blind hole 132 or is filled into the blind hole 132, so as to electrically connect the copper layer 12 and the copper layer on the upper dielectric layer 13.

FIG. 4 shows a schematic view of the conventional substrate having a blind hole under thermal test. The conventional method for forming a blind hole has the following disadvantages. In the substrate 1 having the blind hole 132 made by the above method, since the joining interface of the copper layer 12 and the electroplating copper layer 14 is poor, when the substrate 1 undergoes the thermal test (including thermal cycle test (TCT) and thermal shock test (TST)), a crack 15 is generated in the electroplating copper layer 14 during the temperature change. The crack 15 extends upward from the bottom of the blind hole 132 (i.e., the connecting surface of the copper layer 12 and the electroplating copper layer 14). The crack 15 causes an open circuit between the copper layer 12 and the electroplating copper layer 14, thus reducing the reliability of the substrate 1.

Therefore, it is necessary to provide a substrate having a blind hole and a method for forming the blind hole to solve the above problems.

SUMMARY OF THE INVENTION

The object of the present invention is to provide a method for forming a blind hole in a substrate, which includes:

(a) providing a substrate, the substrate comprising a lower dielectric layer, a copper layer, and an upper dielectric layer, the copper layer located between the lower dielectric layer and the upper dielectric layer, and the lower dielectric layer having an upper surface; and (b) forming an upper dielectric layer through hole and a copper layer through hole by etching through the upper dielectric layer and the copper layer with laser, and forming a cavity on the lower dielectric layer by using the laser, in which the aperture of the cavity on the upper surface of the lower dielectric layer is larger than that of the copper layer through hole.

In this way, a blind hole space in a shape of a rivet can be formed, so that after the blind hole space is electroplated with an electroplating copper layer, the electroplating copper layer is likely to catch the copper layer, thus increasing the bonding force between the electroplating copper layer and the copper layer. Therefore, no crack will be generated in the electroplating copper layer during thermal test, thus enhancing the reliability of the substrate.

Another object of the present invention is to provide a method for forming overlapping blind holes in a substrate, which includes:

(a) providing a substrate, in which the substrate sequentially includes a first dielectric layer, a first copper layer, a second dielectric layer, a second copper layer, and a third dielectric layer, the second dielectric layer having a second dielectric layer through hole therein, the sidewall of the second dielectric layer through hole having a first electroplating copper layer to electrically connect the first copper layer and the second copper layer, and the space defined by the first electroplating copper layer is filled with resin; and (b) forming a third dielectric layer through hole and a second copper layer through hole at positions corresponding to the second dielectric layer through hole by etching through the third dielectric layer and the second copper layer with laser, and forming a second cavity on the resin by using laser, in which the aperture of the second cavity is larger than that of the second copper layer through hole.

DETAILED DESCRIPTION OF THE INVENTION

Figure 5:
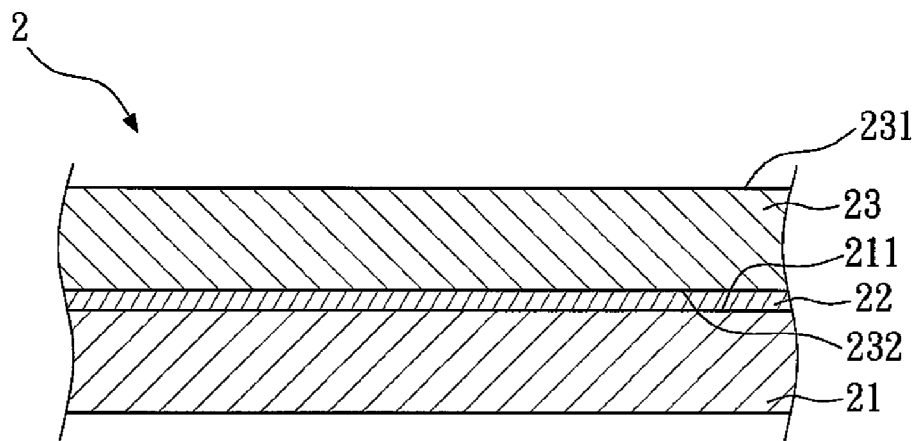
FIGS. 5 to 7 are schematic views of steps of the method for forming a blind hole in a substrate according to a first embodiment of the present invention.
Figure 6:
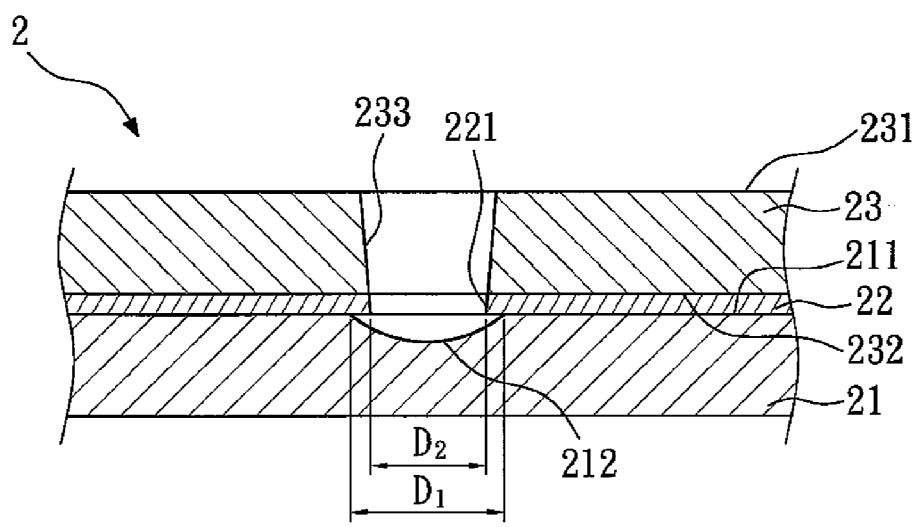
Figure 7:
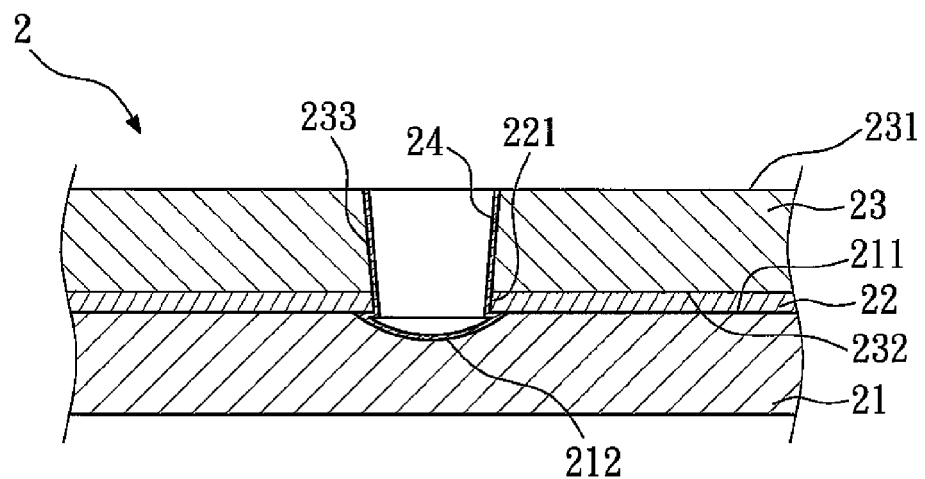

FIGS. 5 to 7 show schematic views of steps of a method for forming a blind hole in a substrate according to a first embodiment of the present invention. Firstly, in FIG. 5, a substrate 2 is provided, which includes a lower dielectric layer 21, a copper layer 22, and an upper dielectric layer 23. The copper layer 22 is located between the lower dielectric layer 21 and the upper dielectric layer 23. The lower dielectric layer 21 has an upper surface 211. The upper dielectric layer 23 has an upper surface 231 and a lower surface 232. The materials of the lower dielectric layer 21 and the upper dielectric layer 23 are resins such as epoxy, phenolic, or polyester. Under normal circumstances, the substrate 1 further comprises a copper layer (not shown) which is located on the upper surface 231 of the upper dielectric layer 23.

Next, a laser (not shown) is provided. In this embodiment, a $CO_2$ laser having a wavelength of 0.2 to 1.0 μm is used.

Next, in FIG. 6, an upper dielectric layer through hole 233 and a copper layer through hole 221 are respectively formed by etching downward from the upper surface 231 of the upper dielectric layer 23 to penetrate the upper dielectric layer 23 and the copper layer 22 with the laser, and a cavity 212 is formed on the top end of the lower dielectric layer 21 by using the laser. That is, the laser does not etch through the lower dielectric layer 21. An aperture $D_1$ of the cavity 212 on the upper surface 211 of the lower dielectric layer 21 is larger than an aperture $D_2$ of the copper layer through hole 221, so a blind hole space formed by the upper dielectric layer through hole 233, the copper layer through hole 221, and the cavity 212 is in a shape of a rivet.

Finally, in FIG. 7, an electroplating copper layer 24 is formed to electrically connect the copper layer 22 and the copper layer on the upper dielectric layer 23. In this embodiment, the electroplating copper layer 24 is located on the side walls of the upper dielectric layer through hole 233, the copper layer through hole 221, and the cavity 212. However, it should be understood that, the electroplating copper layer 24 can also fill the blind hole space formed by the upper dielectric layer through hole 233, the copper layer through hole 221, and the cavity 212.

In the present invention, as the blind hole space formed by the upper dielectric layer through hole 233, the copper layer through hole 221, and the cavity 212 is in a shape of a rivet and penetrates through the copper layer 22, the electroplating copper layer 24 is likely to catch the copper layer 22 at the site of the cavity 212, thus increasing the bonding force between the electroplating copper layer 24 and the copper layer 22. Therefore, no crack will be generated in the electroplating copper layer 24 during thermal test, thus enhancing the reliability of the substrate 2.

Figure 8:
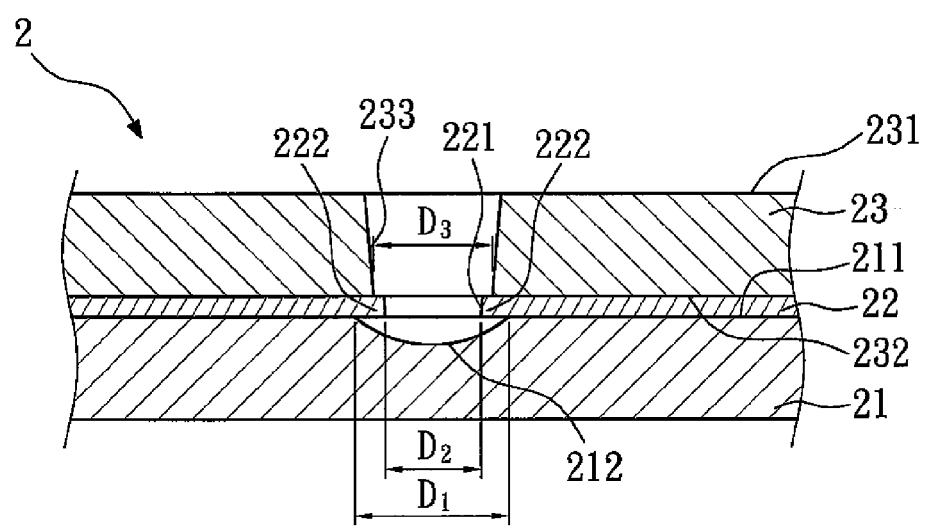
FIG. 8 is a schematic view of the laser processing step of the method for forming a blind hole in a substrate according to a second embodiment of the present invention.

FIG. 8 shows a schematic view of the laser processing steps of the method for forming a blind hole in a substrate according to a second embodiment of the present invention. This embodiment is substantially the same as the first embodiment, so the same elements are designated with the same reference numbers. The difference between this embodiment and the first embodiment merely lies in the laser processing steps. In this embodiment, the laser processing steps are as follows. An upper dielectric layer through hole 233 and a copper layer through hole 221 are respectively formed by etching downward from the upper surface 231 of the upper dielectric layer 23 to penetrate the upper dielectric layer 23 and the copper layer 22 with the laser, and a cavity 212 is formed on the top end of the lower dielectric layer 21 by using the laser. That is, the laser dose not etch through the lower dielectric layer 21. The aperture $D_1$ of the cavity 212 on the upper surface 211 of the lower dielectric layer 21 is larger than the aperture $D_2$ of the copper layer through hole 221, and an aperture $D_3$ of the upper dielectric layer through hole 233 on the lower surface 232 of the upper dielectric layer 23 is larger than the aperture $D_2$ of the copper layer through hole 221. Therefore, the blind hole space formed by the upper dielectric layer through hole 233, the copper layer through hole 221, and the cavity 212 is in a shape of a rivet, and the copper layer 22 forms a suspension part 222 in the blind hole space.

Figure 9:
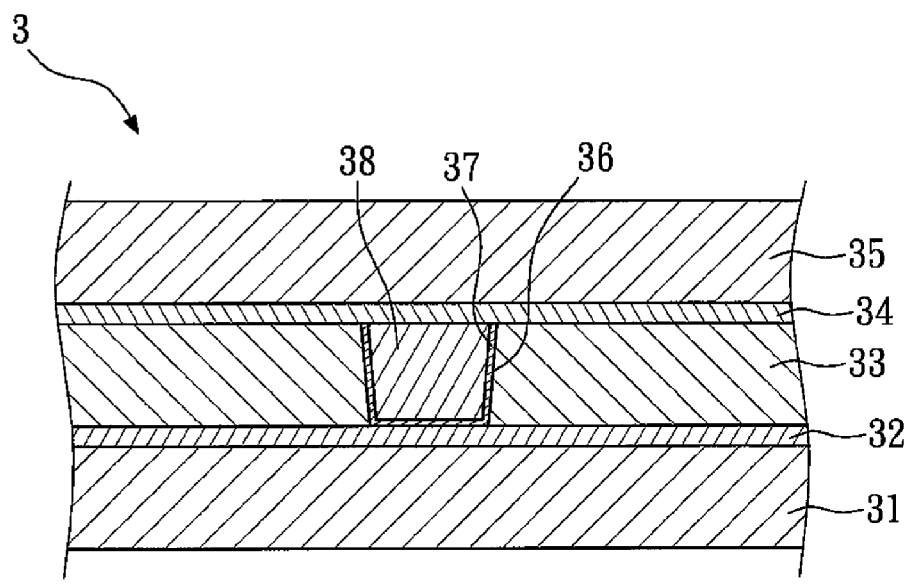
FIGS. 9 to 11 are schematic views of steps of the method for forming a blind hole in a substrate according to a third embodiment of the present invention.
Figure 10:
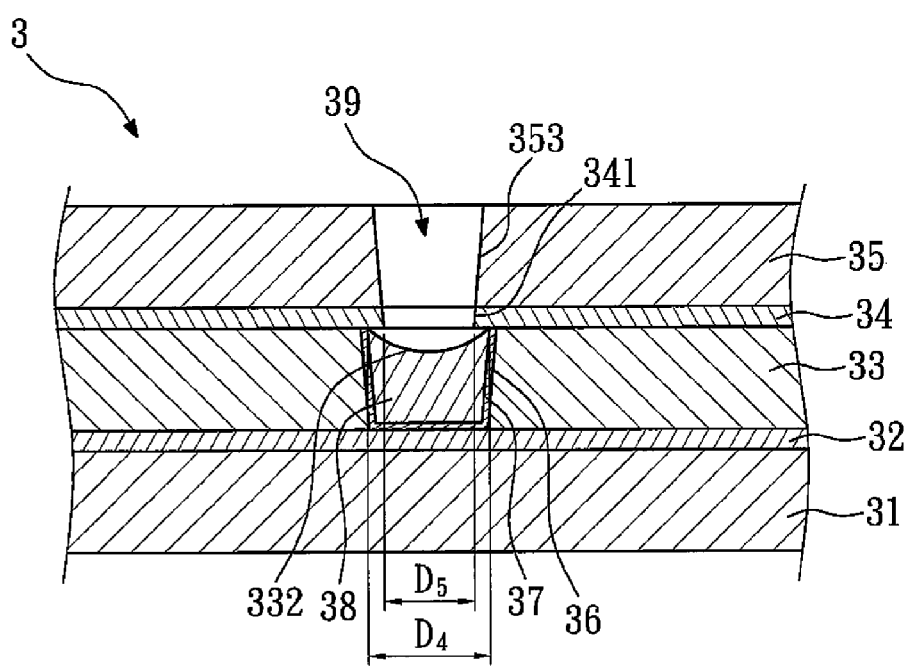
Figure 11:
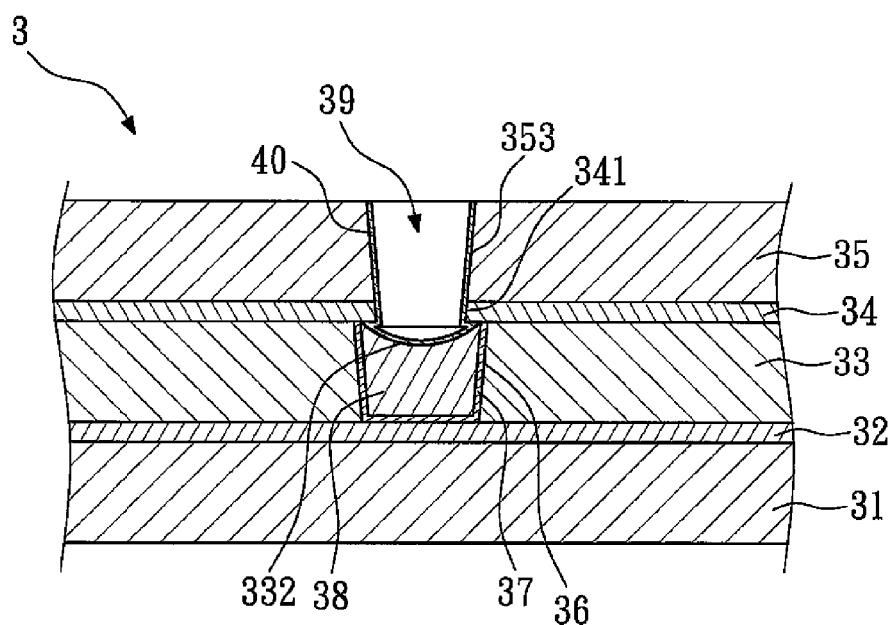
Figure 12:
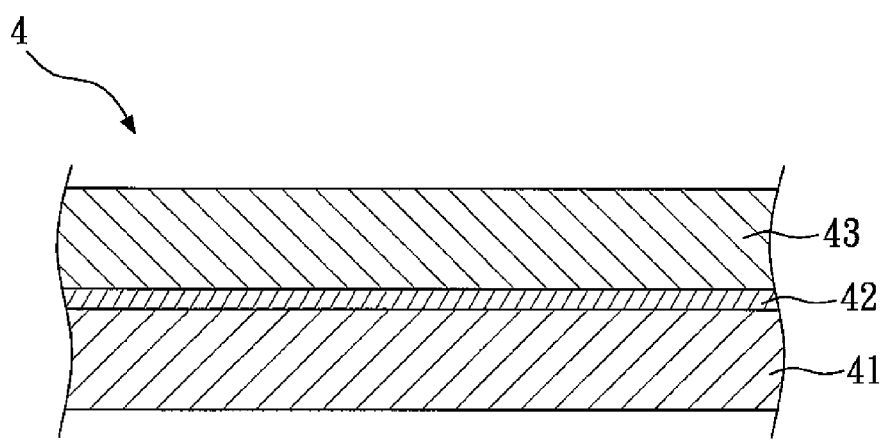
FIGS. 12 to 17 are schematic views of steps of the method for forming a blind hole in a substrate according to a fourth embodiment of the present invention.

FIGS. 9 to 11 show schematic views of steps of the method for forming a blind hole in a substrate according to a third embodiment of the present invention. This embodiment is a design of overlapping holes, that is to say, more than two blind holes vertically overlap each other in the substrate. Firstly, in FIG. 9, a substrate 3 is provided, which sequentially includes a first dielectric layer 31, a first copper layer 32, a second dielectric layer 33, a second copper layer 34, and a third dielectric layer 35. The second dielectric layer 33 has a second dielectric layer through hole therein, and the sidewall of the second dielectric layer through hole has a first electroplating copper layer 37 to electrically connect the first copper layer 32 and the second copper layer 34. The materials of the first dielectric layer 31, the second dielectric layer 33, and the third dielectric layer 35 are resins such as epoxy, phenolic, or polyester. Under normal circumstances, the substrate 3 further comprises a copper layer (not shown) which is located on the upper surface of the third dielectric layer 35.

Figure 1:
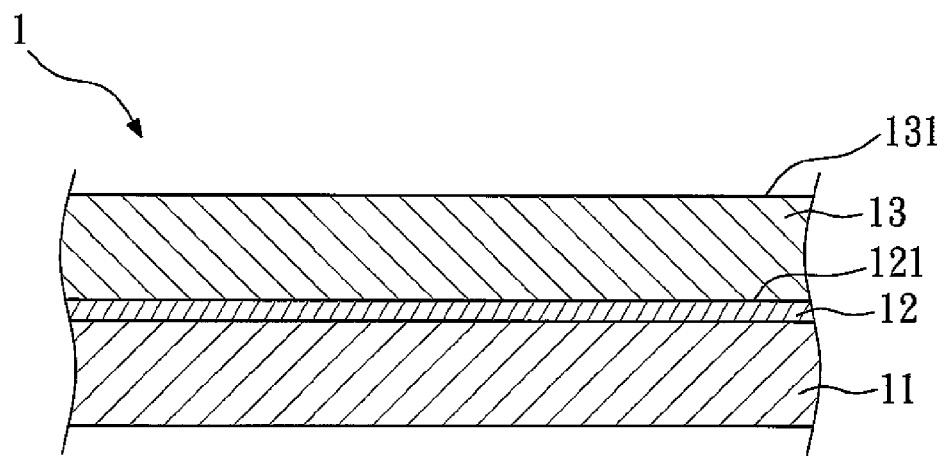
FIGS. 1 to 3 are schematic views of steps of a conventional method for forming a blind hole in a substrate.
Figure 2:
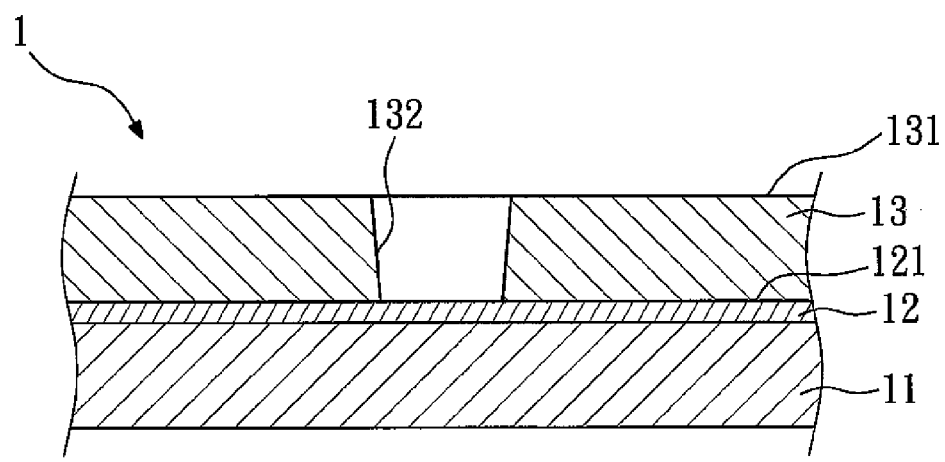
Figure 3:
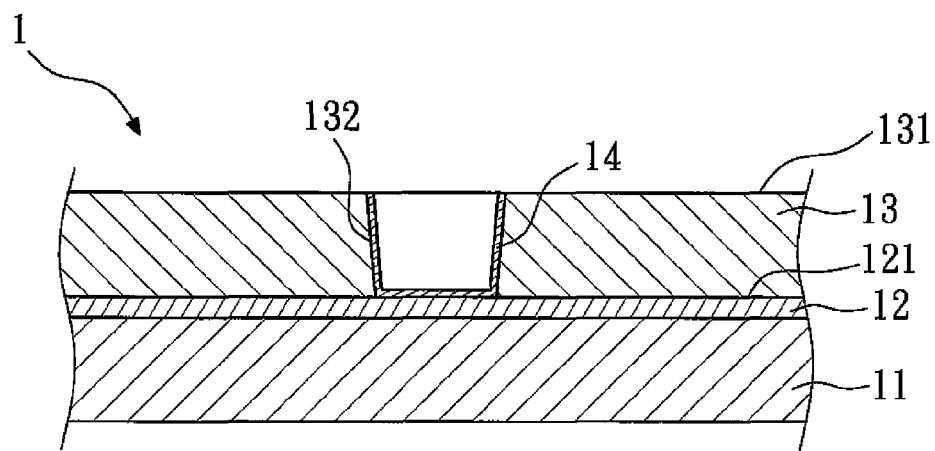
Figure 4:
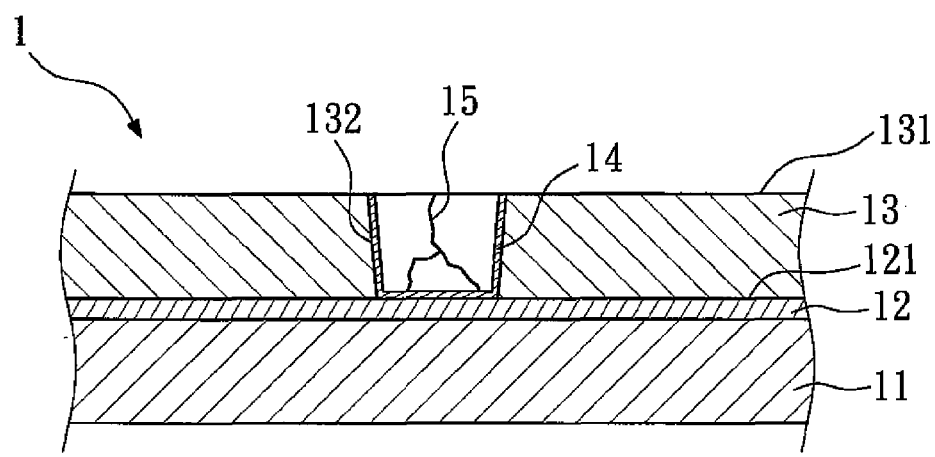
FIG. 4 is a schematic view of the conventional substrate having a blind hole under the thermal test.

In this embodiment, the second dielectric layer through hole and the top surface of the first copper layer 32 form a first blind hole 36, and the first blind hole 36 is a conventional blind hole (for example, the blind hole 132 shown in FIG. 3), which has the electroplating copper layer 37 on the side walls and the space defined by the first electroplating copper layer 37 is filled with a resin 38.

Next, a laser (not shown) is provided. In this embodiment, a $CO_2$ laser having a wavelength of 0.2 to 1.0 μm is used.

Next, in FIG. 10, a third dielectric layer through hole 353 and a second copper layer through hole 341 are respectively formed at positions corresponding to the second dielectric layer through hole by etching through the third dielectric layer 35 and the second copper layer 34 with the laser, and a second cavity 332 is formed on the resin 38 by using the laser, and an aperture $D_4$ of the second cavity 332 is larger than an aperture $D_5$ of the second copper layer through hole 341, so that the third dielectric layer through hole 353, the second copper layer through hole 341, and the second cavity 332 forms a second blind hole 39, and the second blind hole 39 is in a shape of a rivet. It should be understood that, the second blind hole 39 can also have the same shape as that of the blind hole shown in FIG. 8, that is to say, the aperture of the third dielectric layer through hole 353 on the lower surface of the third dielectric layer 35 can be larger than that of the second copper layer through hole 341, so that the second copper layer 34 forms a suspension part in the space of the second blind hole 39.

Finally, in FIG. 11, a second electroplating copper layer 40 is formed to electrically connect the second copper layer 34 and the copper layer above the third dielectric layer 35. In this embodiment, the second electroplating copper layer 40 is located on the side walls of the third dielectric layer through hole 353, the second copper layer through hole 341, and the second cavity 332, i.e., the side wall of the second blind hole 39. However, it should be understood that, the second electroplating copper layer 40 can also fill the space of the second blind hole 39 formed by the third dielectric layer through hole 353, the second copper layer through hole 341, and the second cavity 332.

According to a third embodiment of the present invention, the substrate 3 includes a first dielectric layer 31, a first copper layer 32, a second dielectric layer 33, a second copper layer 34, a third dielectric layer 35, a first blind hole 36, and a second blind hole 39.

The materials of the first dielectric layer 31, the second dielectric layer 33, and the third dielectric layer 35 are resins such as epoxy, phenolic, or polyester. The first copper layer 32 is located on the first dielectric layer 31. The second dielectric layer 33 is located on the first copper layer 32. The second copper layer 34 is located on the second dielectric layer 33. The third dielectric layer 35 is located on the second copper layer 34. The second dielectric layer 33 has a second dielectric layer through hole therein, and the second dielectric layer through hole and the top surface of the first copper layer 32 form a first blind hole 36. The sidewall of the second dielectric layer through hole has a first electroplating copper layer 37 to electrically connect the first copper layer 32 and the second copper layer 34. Preferably, the space defined by the first electroplating copper layer 37 is filled with a resin 38.

The second blind hole 39 is located above the first blind hole 36 and includes a third dielectric layer through hole 353, a second copper layer through hole 341, and a second cavity 332. The third dielectric layer through hole 353 penetrates the third dielectric layer 35. The second copper layer through hole 341 penetrates the second copper layer 34. The second cavity 332 is located on the resin 38, and the aperture of the second cavity 332 is larger than that of the second copper layer through hole 341. The second blind hole 39 is in a shape of a rivet. It should be understood that, the second blind hole 39 can also have the same shape as that of the blind hole shown in FIG. 8, that is to say, the aperture of the third dielectric layer through hole 353 on the lower surface of the third dielectric layer 35 can be larger than that of the second copper layer through hole 341, so that the second copper layer 34 forms a suspension part in the space of the second blind hole.

Preferably, the second blind hole 39 further includes a second electroplating copper layer 40, which is located on the side walls of the third dielectric layer through hole 353, the second copper layer through hole 341, and the second cavity 332. Alternatively, the second electroplating copper layer 40 can also fill the space formed by the third dielectric layer through hole 353, the second copper layer through hole 341, and the second cavity 332.

FIGS. 12 to 17 show schematic views of steps of the method for forming a blind hole in a substrate according to a fourth embodiment of the present invention. This embodiment is a design of overlapping holes, that is to say, more than two blind holes vertically overlap each other in the substrate. Firstly, in FIG. 12, a substrate 4 is provided, which sequentially includes a first dielectric layer 41, a first copper layer 42, and a second dielectric layer 43. The materials of the first dielectric layer 41 and the second dielectric layer 43 are resins such as epoxy, phenolic, or polyester. Next, a laser (not shown) is provided. In this embodiment, a $CO_2$ laser having a wavelength of 0.2 to 1.0 µm is used.

Figure 13:
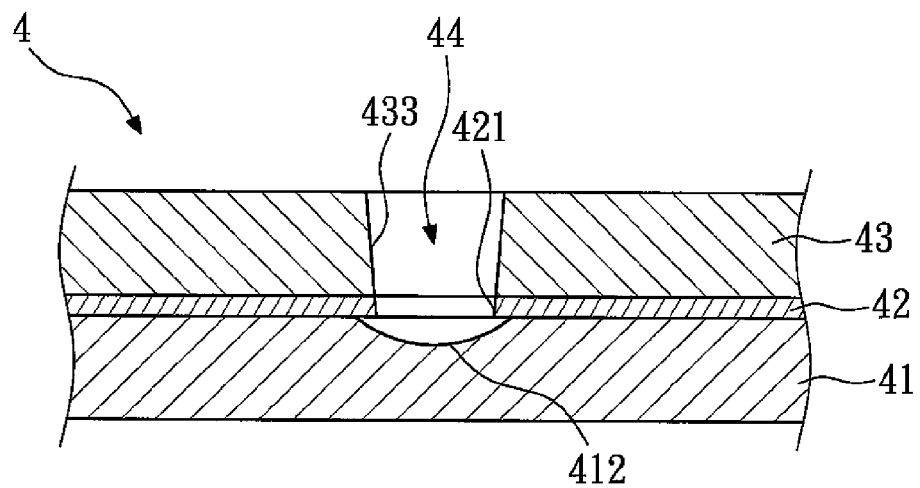

Next, in FIG. 13, a second dielectric layer through hole 433 and a first copper layer through hole 421 are respectively formed by etching through the second dielectric layer 43 and the first copper layer 42 with laser, and a first cavity 412 is formed on the first dielectric layer 41 by using the laser, and the aperture of the first cavity 412 is larger than that of the first copper layer through hole 421. The second dielectric layer through hole 433, the first copper layer through hole 421, and the first cavity 412 form a first blind hole 44.

Figure 14:
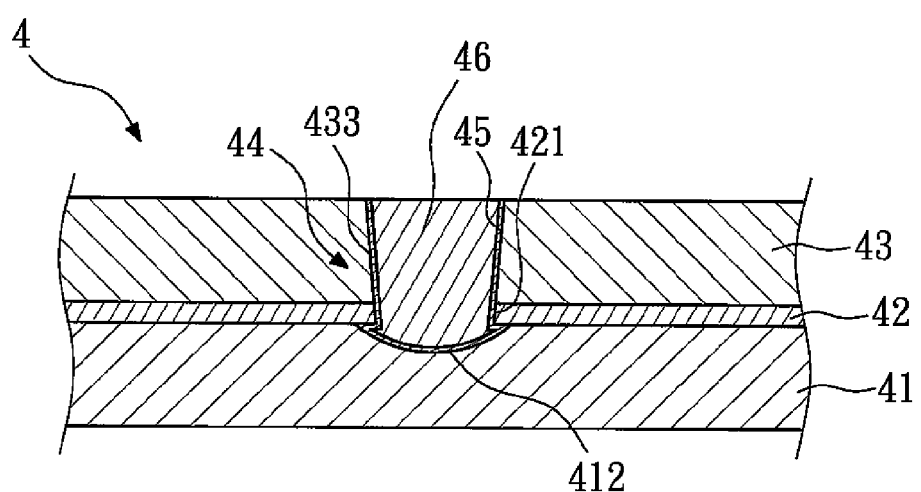

Next, in FIG. 14, a first electroplating copper layer 45 is formed on the side walls of the second dielectric layer through hole 433, the first copper layer through hole 421, and the first cavity 412, i.e., the side wall of the first blind hole 44. Preferably, the first blind hole 44 is filled with a resin 46.

Figure 15:
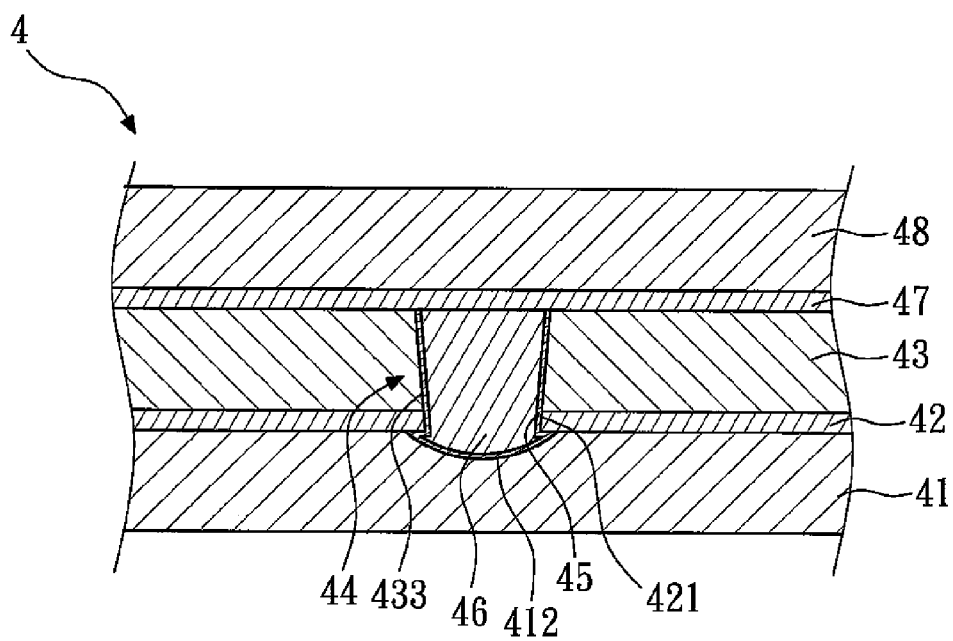

Next, in FIG. 15, a second copper layer 47 is formed on the second dielectric layer 43, and a third dielectric layer 48 is formed on the second copper layer 47. The second copper layer 47 is electrically connected to the first copper layer 42 through the first electroplating copper layer 45. Preferably, a copper layer (not shown) is further formed on the third dielectric layer 48.

Next, a laser (not shown) is provided. In this embodiment, a $CO_2$ laser having a wavelength of 0.2 to 1.0 µm is used.

Figure 16:
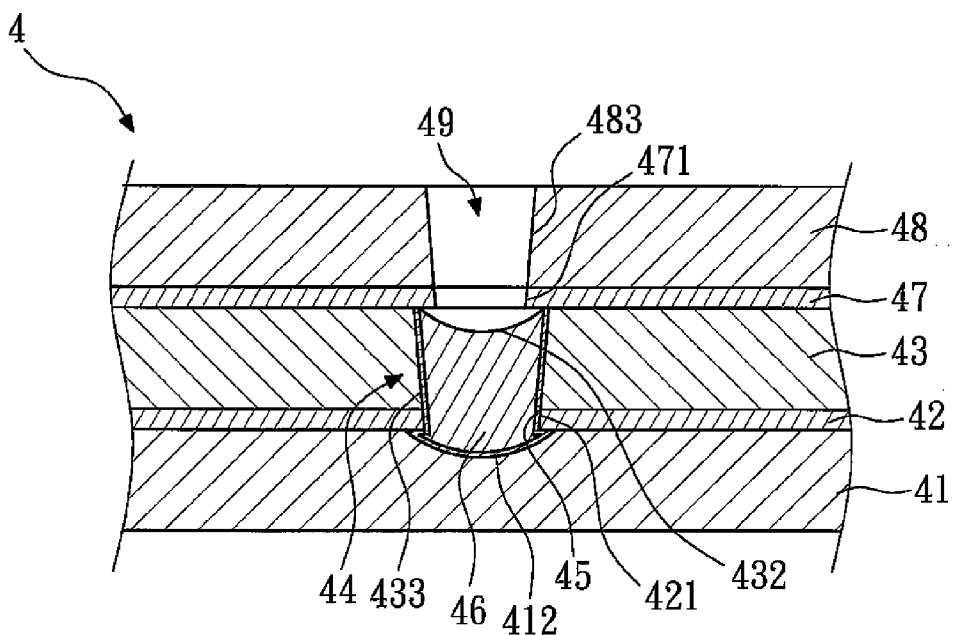

Next, in FIG. 16, a third dielectric layer through hole 483 and a second copper layer through hole 471 are respectively formed on positions corresponding to the first blind hole 44 by etching through the third dielectric layer 48 and the second copper layer 47 with the laser, and a second cavity 432 is formed on the resin 46 of the first blind hole 44 by using the laser. The aperture of the second cavity 432 is larger than that of the second copper layer through hole 471, so that the third dielectric layer through hole 483, the second copper layer through hole 471, and the second cavity 432 form a second blind hole 49, which is in a shape of a rivet. It should be understood that, the second blind hole 49 can also have the same shape as that of the blind hole shown in FIG. 8, that is to say, the aperture of the third dielectric layer through hole 483 on the lower surface of the third dielectric layer 48 can be larger than that of the second copper layer through hole 471, so that the second copper layer 47 forms a suspension part in the space of the second blind hole 49.

Figure 17:
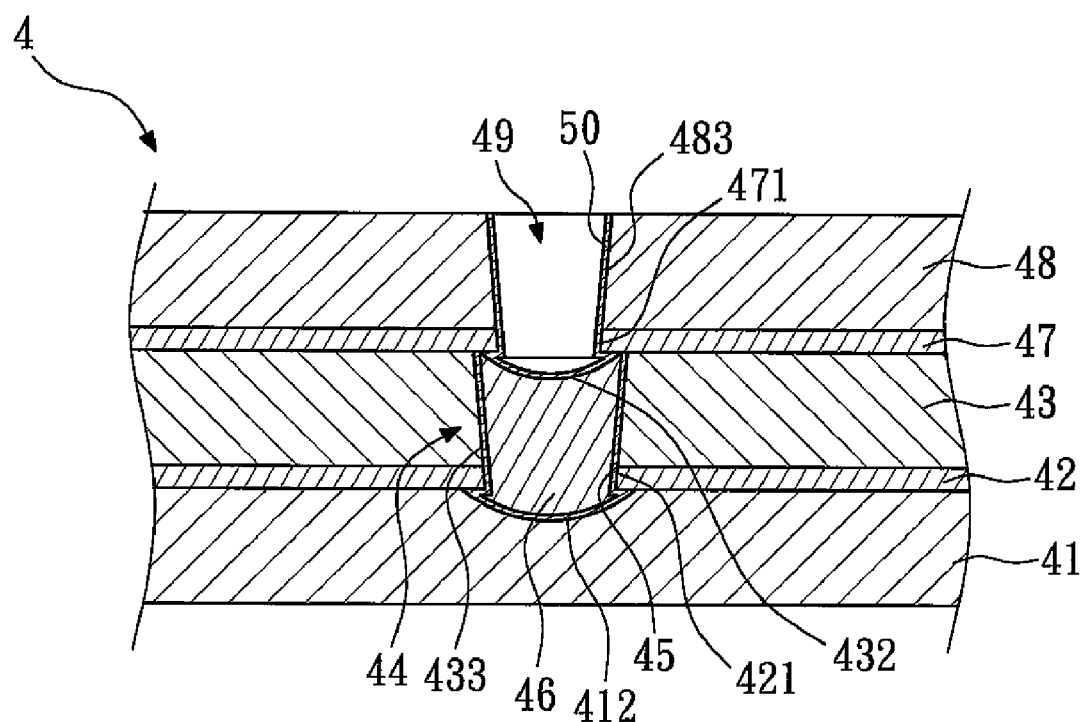

Finally, in FIG. 17, a second electroplating copper layer 50 is formed to electrically connect the second copper layer 47 and the copper layer above the third dielectric layer 48. In this embodiment, the second electroplating copper layer 50 is located on the side walls of the third dielectric layer through hole 483, the second copper layer through hole 471, and the second cavity 432, i.e., the side wall of the second blind hole 49. However, it should be understood that, the second electroplating copper layer 50 can also fill the space of the second blind hole 49 formed by the third dielectric layer through hole 483, the second copper layer through hole 471, and the second cavity 432.

According to a forth embodiment of the present invention, the substrate 4 includes a first dielectric layer 41, a first copper layer 42, a second dielectric layer 43, a second copper layer 47, a third dielectric layer 48, a first blind hole 44, and a second blind hole 49.

The materials of the first dielectric layer 41, the second dielectric layer 43, and the third dielectric layer 48 are resins such as epoxy, phenolic, or polyester. The first copper layer 42 is located on the first dielectric layer 41. The second dielectric layer 43 is located on the first copper layer 42. The second copper layer 47 is located on the second dielectric layer 43. And the third dielectric layer 48 is located on the second copper layer 47.

The first blind hole 44 is located in the second dielectric layer 43 and includes a second dielectric layer through hole 433, a first copper layer through hole 421, and a first cavity 412. The second dielectric layer through hole 433 penetrates through the second dielectric layer 43. The first copper layer through hole 421 penetrates the first copper layer 42. The first cavity 412 is located on the first dielectric layer 41, and the aperture of the first cavity 412 is larger than that of the second copper layer through hole 421. It should be understood that, the first blind hole 44 can also have the same shape as that of the blind hole shape shown in FIG. 8. The first electroplating copper layer 45 is located on the side walls of the second dielectric layer through hole 433, the first copper layer through hole 421, and the first cavity 412. Preferably, the first blind hole 44 is filled with a resin 46.

The second blind hole 49 is located above the first blind hole 44 and includes a third dielectric layer through hole 483, a second copper layer through hole 471, and a second cavity 432. The third dielectric layer through hole 483 penetrates the third dielectric layer 48. The second copper layer through hole 471 penetrates the second copper layer 47. The second cavity 432 is located in the first blind hole 44, and the aperture of the second cavity 432 is larger than that of the second copper layer through hole 471. The second blind hole 49 is in a shape of a rivet. It should be understood that, the second blind hole 49 can also have the same shape as that of the blind hole shown in FIG. 8.

Preferably, the second blind hole 49 further includes a second electroplating copper layer 50, and the second electroplating copper layer 50 is located on the side walls of third dielectric layer through hole 483, the second copper layer through hole 471, and the second cavity 432. Alternatively, the second electroplating copper layer 50 can also fill the space formed by the third dielectric layer through hole 483, the second copper layer through hole 471, and the second cavity 432.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming a blind hole in a substrate, comprising:
    (a) providing a substrate, the substrate sequentially comprising a first dielectric layer, a first copper layer, a second dielectric layer, a second copper layer, and a third dielectric layer, the second dielectric layer having a second dielectric layer through hole therein, the sidewall of the second dielectric layer having a first electroplating copper layer to electrically connect the first copper layer and the second copper layer, and the space defined by the first electroplating copper layer is filled with resin; and
    (b) forming a third dielectric layer through hole and a second copper layer through hole at positions corresponding to second dielectric layer through hole by etching through the third dielectric layer and the second copper layer with a laser, and forming a second cavity on the resin by using the laser, wherein an aperture of the second cavity is larger than that of the second copper layer through hole.

2. The method as claimed in claim 1, wherein an aperture of the third dielectric layer through hole on a lower surface of the third dielectric layer is larger than that of the second copper layer through hole.

3. The method as claimed in claim 1, wherein the materials of the first dielectric layer, the second dielectric layer, and the third dielectric layer are resin.

4. The method as claimed in claim 1, further comprising a step of forming a second electroplating copper layer, wherein the second electroplating copper layer is located on side walls of the third dielectric layer through hole, the second copper layer through hole, and the second cavity.

5. The method as claimed in claim 1, further comprising a step of forming a second electroplating copper layer, wherein the second electroplating copper layer is filled into a space formed by the third dielectric layer through hole, the second copper layer through hole, and the second cavity.

6. The method as claimed in claim 1, wherein the Step (a) comprises:
    (a1) providing the substrate, wherein the substrate sequentially comprises the first dielectric layer, the first copper layer, and the second dielectric layer;
    (a2) forming a second dielectric layer through hole and a first copper layer through hole by etching through the second dielectric layer and the first copper layer with the laser, and forming a first cavity on the first dielectric layer by using the laser, wherein an aperture of the first cavity is larger than that of the first copper layer through hole, and the second dielectric layer through hole, the first copper layer through hole, and the first cavity form a first blind hole;
    (a3) forming the first electroplating copper layer in the first blind hole;
    (a4) forming the second copper layer on the second dielectric layer, wherein the second copper layer is electrically connected to the first copper layer through the first electroplating copper layer; and
    (a5) forming the third dielectric layer on the second copper layer.

7. The method as claimed in claim 6, wherein the Step (a3) comprises a step of filling the resin into the second dielectric layer through hole, the first copper layer through hole, and the first cavity.

8. The method as claimed in claim 1, wherein the laser in the Step (b) is a $CO_2$ laser.

9. The method as claimed in claim 1, wherein the second dielectric layer through hole and a top surface of the first copper layer form a first blind hole in the Step (a).

* * * * *